(12) United States Patent
Chang et al.

(10) Patent No.: US 11,222,884 B2
(45) Date of Patent: Jan. 11, 2022

(54) LAYOUT DESIGN METHODOLOGY FOR STACKED DEVICES

(71) Applicant: Taiwan Semiconductor Manufacturing Co., Ltd., Hsinchu (TW)

(72) Inventors: Fong-Yuan Chang, Hsinchu County (TW); Chin-Chou Liu, Hsinchu County (TW); Chin-Her Chien, Taoyuan County (TW); Po-Hsiang Huang, Tainan (TW); Ka Fai Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 129 days.

(21) Appl. No.: 16/530,631

(22) Filed: Aug. 2, 2019

(65) Prior Publication Data
US 2020/0168595 A1    May 28, 2020

Related U.S. Application Data

(60) Provisional application No. 62/772,391, filed on Nov. 28, 2018.

(51) Int. Cl.
| | |
|---|---|
| *H01L 25/065* | (2006.01) |
| *H01L 27/02* | (2006.01) |
| *H01L 27/06* | (2006.01) |
| *G11C 8/18* | (2006.01) |
| *H01L 23/48* | (2006.01) |

(52) U.S. Cl.
CPC ............ *H01L 27/0207* (2013.01); *G11C 8/18* (2013.01); *H01L 23/481* (2013.01); *H01L 25/0657* (2013.01); *H01L 27/0688* (2013.01)

(58) Field of Classification Search
CPC .................................................. H01L 25/0657
See application file for complete search history.

(56) References Cited

U.S. PATENT DOCUMENTS

| | | | |
|---|---|---|---|
| 9,135,185 B2 * | 9/2015 | Loh | ......................... H01L 25/18 |
| 2012/0272112 A1 * | 10/2012 | Oh | ................. G01R 31/318555 |
| | | | 714/727 |
| 2014/0181458 A1 * | 6/2014 | Loh | ..................... G06F 12/1027 |
| | | | 711/206 |

(Continued)

*Primary Examiner* — Douglas M Menz
(74) *Attorney, Agent, or Firm* — Sterne, Kessler, Goldstein & Fox P.L.L.C.

(57) ABSTRACT

A layout design methodology is provided for a device that includes two or more identical structures. Each device can have a first die, a second die stacked over the first die and a third die stacked over the second die. The second die can include a first through-silicon via (TSV) and a first circuit, and the third die can include a second TSV and a second circuit. The first TSV and the second TSV can be linearly coextensive. The first and second circuit can each be a logic circuit having a comparator and counter used to generate die identifiers. The counters of respective device die can be connected in series between the dice. Each die can be manufactured using the same masks but retain unique logical identifiers. A given die in a stack of dice can thereby be addressed by a single path in a same die layout.

20 Claims, 10 Drawing Sheets

(56) References Cited

U.S. PATENT DOCUMENTS

| | | | | |
|---|---|---|---|---|
| 2015/0016172 A1* | 1/2015 | Loh | ............................ | G11C 5/02 |
| | | | | 365/51 |
| 2015/0155039 A1* | 6/2015 | Tran | ...................... | G11C 7/1045 |
| | | | | 365/185.18 |
| 2015/0357306 A1* | 12/2015 | Thottethodi | ............ | H04L 45/021 |
| | | | | 370/351 |
| 2020/0043530 A1* | 2/2020 | Shibata | .................... | G11C 5/063 |
| 2020/0051999 A1* | 2/2020 | Delacruz | ............ | H03K 19/17796 |

* cited by examiner

LAYOUT DESIGN METHODOLOGY FOR STACKED DEVICES

CROSS-REFERENCE TO RELATED APPLICATIONS

The present application claims the benefit of U.S. Provisional Patent Appl. No. 62/772,391, filed Nov. 28, 2018, titled "Same Layout Design Methodology with TSV," which is incorporated herein by reference in its entirety.

BACKGROUND

The fabrication of integrated circuits (ICs) require mask techniques, such as the use of photomasks to etch and process circuit designs. However, due to increasingly smaller and complicated IC requirements, device design is more challenging than ever. The number of circuit elements required in a given IC space is increasingly more complex. As a result, the cost of photomask sets for advanced IC processes has increased substantially, particularly as IC designs shrink. With ever-rising mask generation costs being an increasing factor in the expense of an IC chip, economizing mask cost is a significant focus of IC design.

Likewise, when a new IC design requires an engineering change order (ECO), mask cost can contribute substantially. To make incremental changes at a chip level, a design may incorporate spare or dummy cells, including unused wires and metals to minimize the requirement of new masks in metal-only ECOs. However, redundancy involved in the use of dummy wires and the like does not reduce mask costs at the packaging level.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

Figure 1:
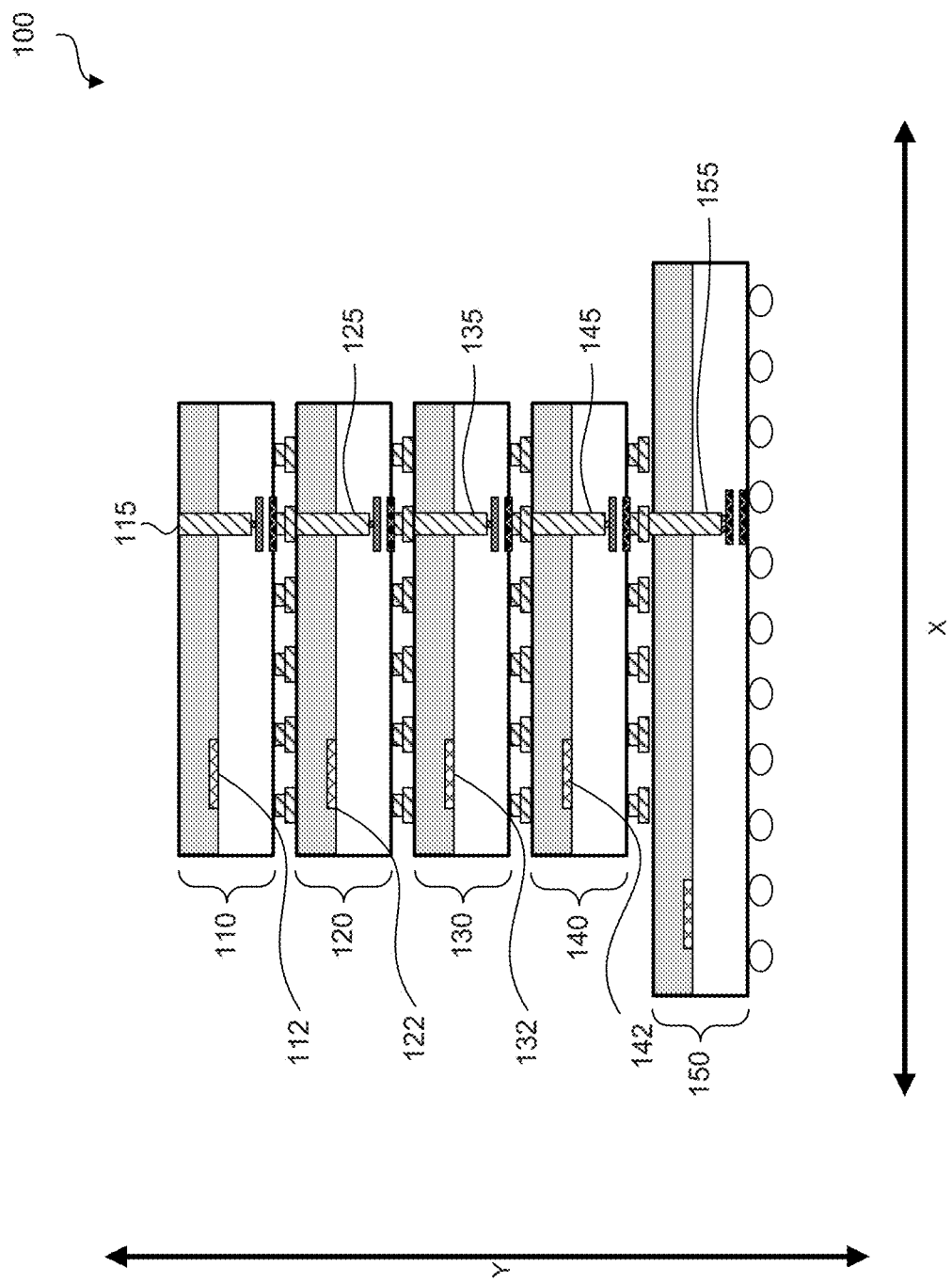
FIG. 1 is an illustration of system on integrated chip structures including a memory device, according to some embodiments.

The accompanying drawings, which are incorporated herein and form part of the specification, illustrate the present disclosure and, together with the description, further serve to explain the principles of the disclosure and to enable a person skilled in the relevant art to make and use the disclosure.

DETAILED DESCRIPTION

Overview

The present disclosure is directed to design methodologies, for example, of three dimensional integrated circuit (3DIC) design. As a the cost of photomask sets for IC design increases, a focus of IC design is to reduce mask requirements. Embodiments of the present disclosure achieve redundancy between individual mask cells in a 3DIC package, resulting in improved efficiency, expense, and yield of the 3DIC design. In embodiments of the present disclosure, 3DIC bit cells of the 3DIC package can be uniquely addressed, notwithstanding their identical structure. As a result, a same mask may be used among otherwise separate and unique 3DIC bit cells.

A benefit of the design methodology disclosed herein is that reduced mask requirements and cost may be achieved without depending on a specific IC process technology platform. That is, an IC design can maintain the same methodology according to embodiments of this disclosure when migrating from one process technology generation to a later generation. The methodology and structural concepts described herein do not depend on the specific structural configuration of respective device cells. Thus, the methodology can be applied to various 3DICs and systems on integrated circuit (SOIC) packages.

The present disclosure is directed to reducing mask requirements and cost, where a device includes multiple parts (e.g., dice), some of which share a common logic function. For example, a memory system, e.g., a static random access memory (SRAM), a dynamic random-access memory (DRAM), a magnetoresistive random-access memory (MRAM), or the like, can include four bit-cell device dice having the same logic function and a controller (or an application processor) die. The bit-cell device dice can have the same design (e.g., the same structural layout).

In other designs, bit-cell device dice may require dissimilar designs to enable the bit cells to be uniquely addressed. For example, a wiring between individual bit-cell device die may be different to enable addressing of the respective bit-cell device die. With the wiring being different, bit-cell device die addressing may be performed by connections through different through-silicon via (TSV) channels, resulting in manufacturing of bit-cell device die with different photomasks.

In some embodiments, a device can include four bit-cell device dice, which can be memory dice and a controller device die (also referred to herein as a processor, a processor die, or an application processor) having twice the area of an individual bit-cell device die. Where, for example, the controller die counts for 2 mask units and each bit-cell device die counts for 1 mask unit, embodiments of the present disclosure reduce the mask requirement by 50% over other designs. Thus, implementing the same design for each individual bit cell device die (also referred to herein as a memory device die) reduces the mask requirement to 3 mask units, as compared to 6 mask units in other designs.

Embodiments of the present disclosure include a bit-cell architecture that reduces fabrication complexity, mask requirements and cost. Embodiments of the present disclosure include uniform bit-cell device dice that maintain unique addressing identifiers capable of fabrication using a single or reduced set of masks The embodiments described herein include, but are not limited to, IC dice such as SOICs, 3DICs, SRAMs, DRAMs, MRAMs, processors, or the like.

In some embodiments, an SOIC structure includes active (e.g., having one or more transistors) dice stacked one on top of another and interconnected vertically using TSVs. The SOIC structure can be a three-dimensional integrated circuit ("3DIC"). For example, the 3DIC includes a stack of similar active dice, such as a stack of memory dice with a processor (a controller logic) on a separate die, such as a bottom die. In the alternative, the 3DIC can include a stack of different die. The die can be stacked face to back (F2B). If stacked F2B, at least two die are stacked, one on top of the other, with their active areas each in the same orientation (e.g., on the face surface) and metallization on the opposite surface. Here, the lower die includes metallization on a back surface of a substrate and electrical connectors (e.g., hybrid bonded connections, microbumps, or the like) to connect an upper die (e.g., first die) to the metallization. TSVs pass through the lower die's substrate to connect the electrical connectors on the upper die, via the back-surface metallization, to the active area of the lower die (e.g., second die). Alternatively, the dice can be stacked face to face (F2F) in which the active areas of the lower die and the upper die face each other with electrical connectors providing connectivity between the dice.

FIG. 1 illustrates an SOIC package 100, according to some embodiments. SOIC package 100 includes memory dice 110, 120, 130, and 140, stacked on a processor die 150 (which may also be referred to as an application processor (AP) die 150). Memory dice 110, 120, 130, and 140 can include one or more SRAM devices, DRAM devices, MRAM devices, other suitable memory devices, or combinations thereof. Prior to stacking memory dice 110-140, a contact surface of each memory die is planarized and the memory die are bonded at these contact surfaces using suitable bonding technologies, such as hybrid bonding, fusion bonding, anodic bonding, direct bonding, room temperature bonding, pressure bonding, and/or combinations thereof. Each of memory dice 110-140 has a memory function to store memory data and an addressing function to generate a unique memory die identifier. Data can be input or retrieved by addressing the unique memory die identifier of the respective memory die. Processor die 150 can include one or more microprocessors, central processing units, graphics processing units, other suitable processing units, or a combination thereof.

As shown in FIG. 1, the memory dice 110-140 and the processor die 150 respectively include through-silicon vias (TSVs) 115, 125, 135, 145, and 155. Memory dice 110-140 can respectively include addressing circuits 112, 122, 132, and 142. The structure of memory dice 110-140 can be identical. That is, memory die 110 can be structurally identical to memory die 120, and so forth.

When arranged over a processor die 150, memory dice 110-140 can be stacked in such manner that the structural components thereof overlap linearly, according to some embodiments. For example, TSV 115 of memory die 110 can coextend linearly with TSV 125 of memory die 120. Likewise, logic circuit 112 of memory die 110 overlaps with logic circuit 122 of memory die 120, and so forth. Memory dice 110-140 can be stacked such that TSVs 115 coextend linearly (e.g., in the y-direction).

Electrical connectors can pass through TSVs 115, 125, 135, and 145 to carry data and address signals to each respective memory die. FIG. 1 illustrates a single TSV in each corresponding memory die, in which the TSVs coextend linearly with respect to each other. Alternatively, each memory die can include multiple TSVs, in which the multiple TSVs of the memory dice overlap and coextend linearly.

A drawback of other device architectures is that certain control signals must be uniquely transmitted to individual memory dice for the device package to function. Even when address and data lines are shared by individual memory dice, for example, chip enable (CE) signals used to select an individual bit-cell device die are not shared.

Embodiments of this disclosure provide a technical solution where an SOIC package, such as a 3DIC including SRAM, DRAM, MUM, or other memory circuitry, permits signals to be transmitted and received by a common or identical structural arrangement of each individual bit-cell device die, without precluding unique addressing of individual memory elements. For example, the CE signal can be commonly transmitted to each bit cell device die, while enabling selection of the intended individual bit-cell device die.

Figure 2:
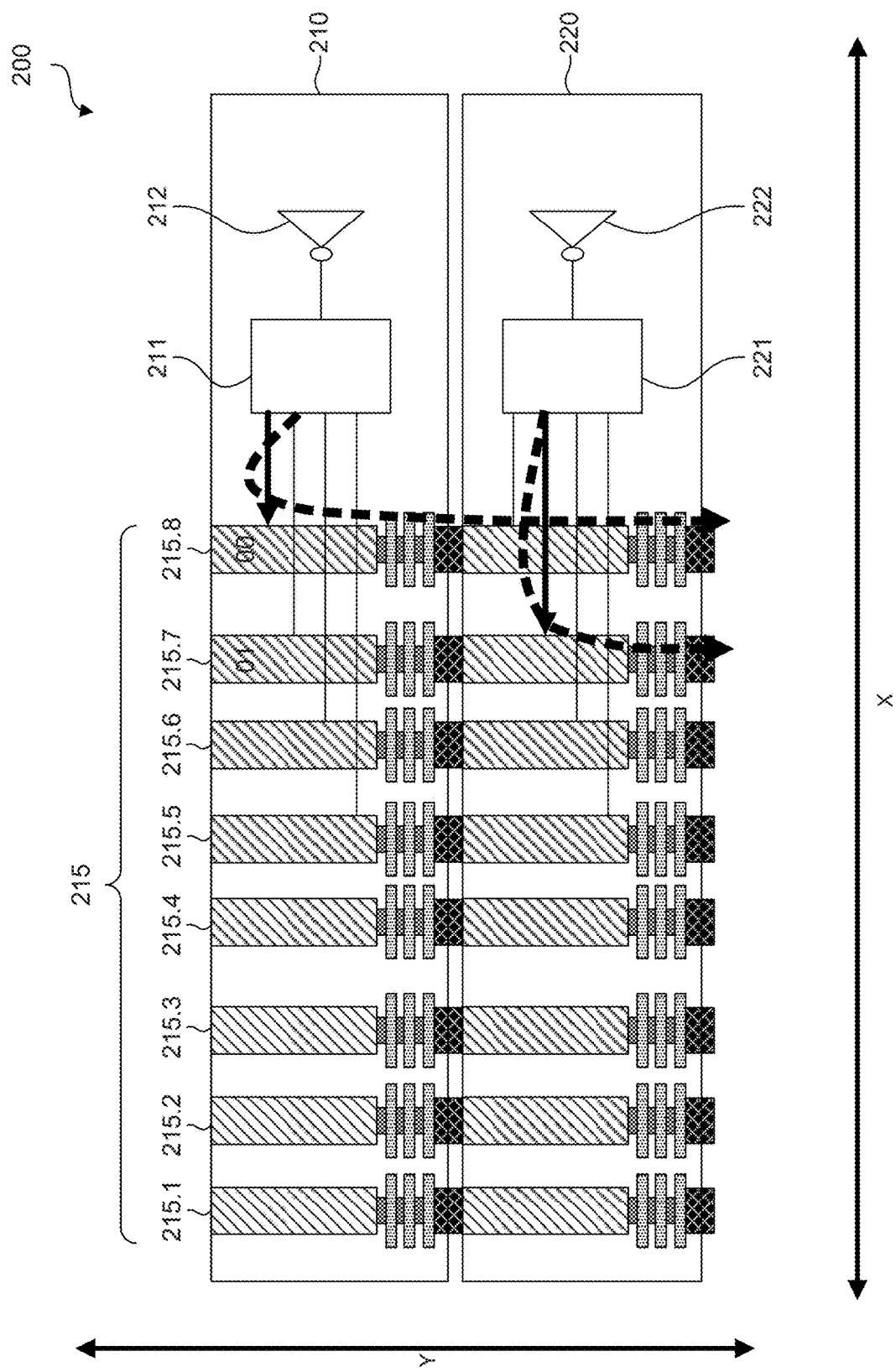
FIG. 2 is an illustration of system on integrated chip structures, according to some embodiments.
Figure 3:
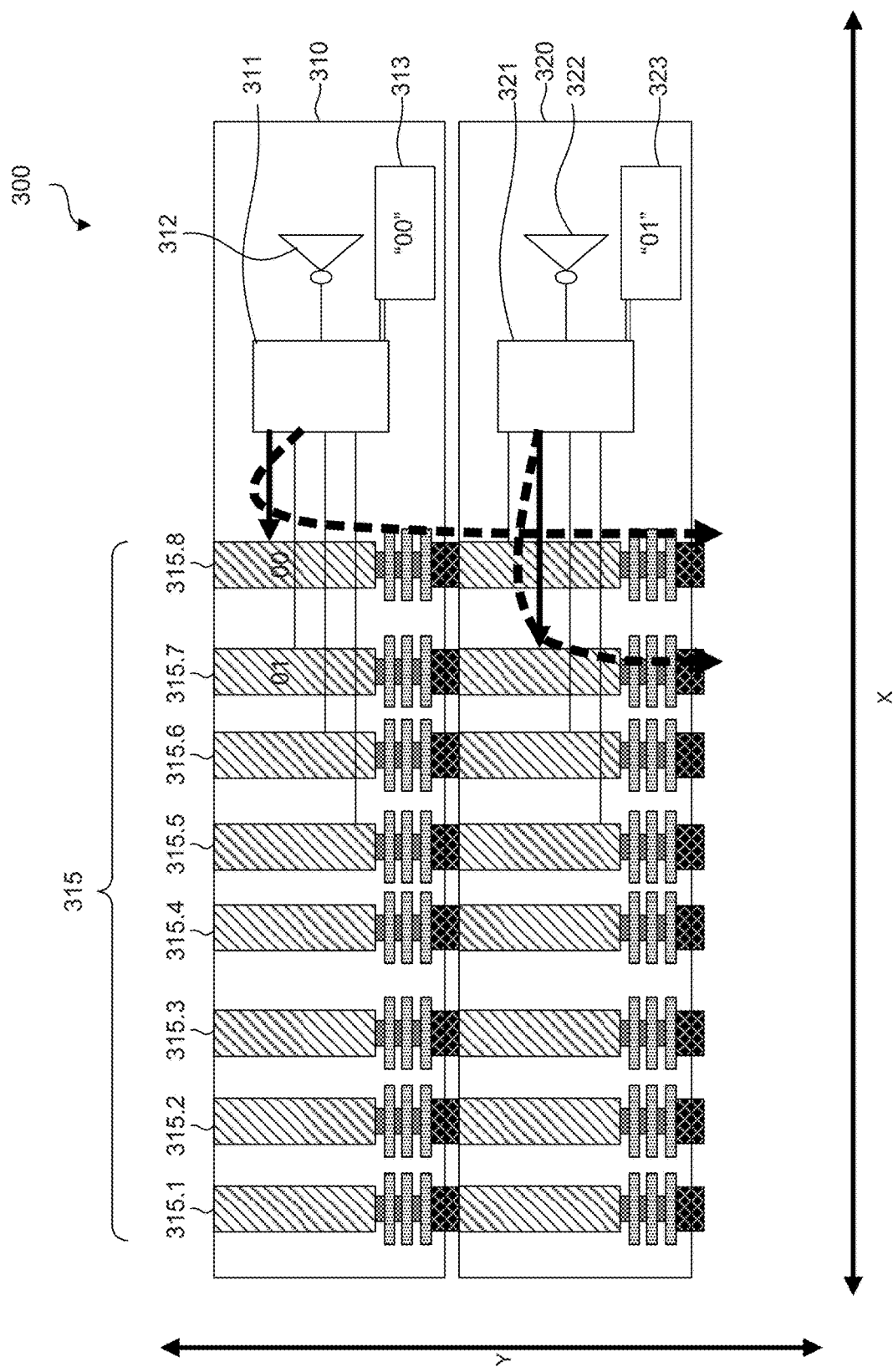
FIG. 3 is an illustration of system on integrated chip structures including non-volatile address storage, according to some embodiments.
Figure 4:
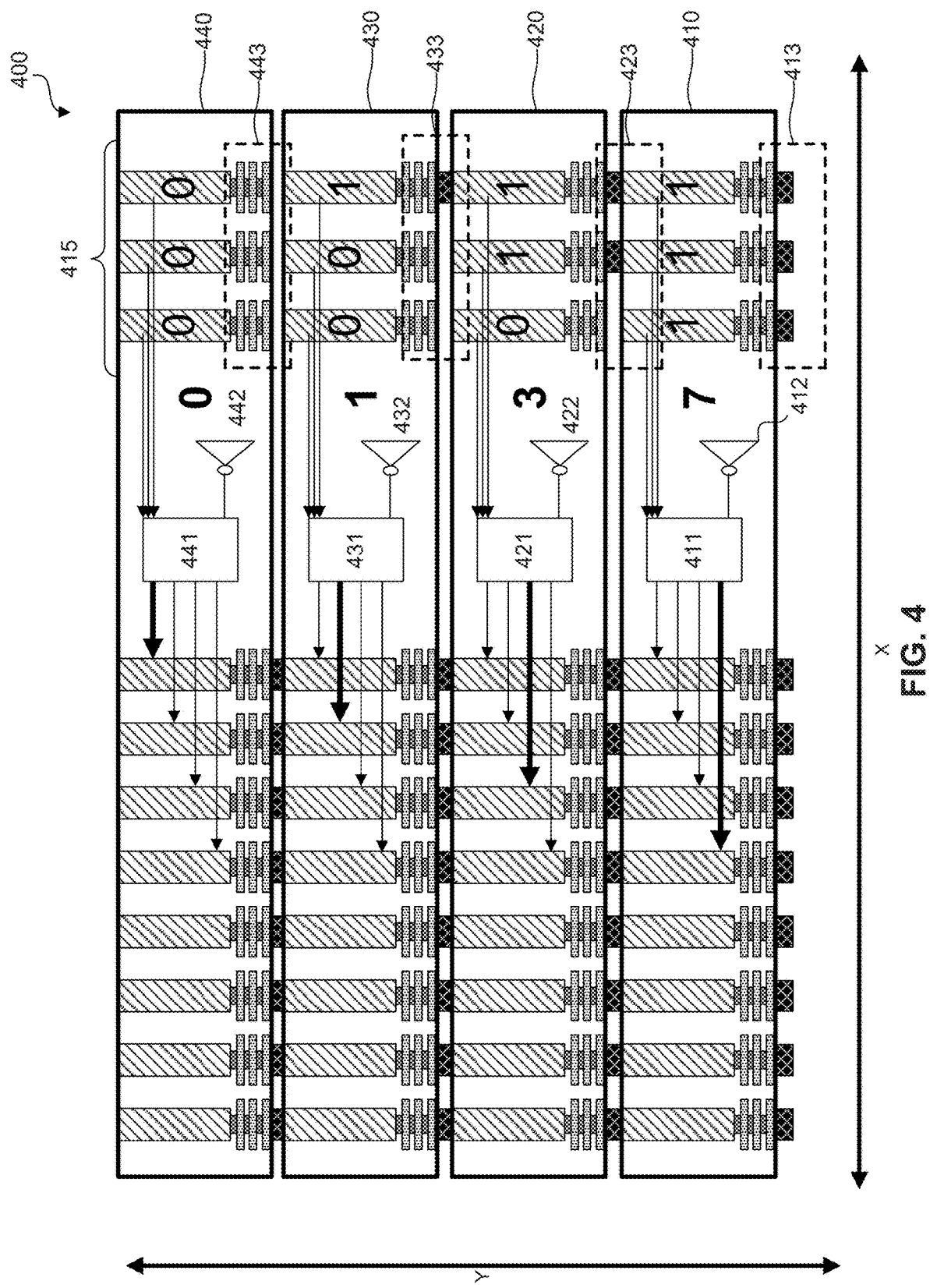
FIG. 4 is an illustration of system on integrated chip structures including address identification provided by through-silicon vias, according to some embodiments.

FIGS. 2 to 4 illustrate a methodology of using TSVs to selectively identify a bit-cell device die address. The methodology includes the use of a multiplexer to address two bit-cell device dice in a portion of an exemplary integrated circuit package. For example, as shown in FIG. 2, bit-cell device dice 210 and 220 each includes a multiplexer, a comparator, and TSVs 215. Individual bit-cell device dice 210 and 220 can be selectively addressed through address signals 215.1 to 215.8 transmitted through TSVs 215.

Bit-cell device die 210 includes multiplexer 211, inverter 212, and TSVs 215 corresponding to signals 215.1 to 215.8. In embodiments, each bit-cell device die can have identical structure. For example, TSVs 215 can be formed as a TSV architecture across multiple bit-cell device dice, using the same or a reduced number of masks. As a result, the bit-cell device dice can be addressed without regard to a specific bit-cell device arrangement or organization. For example, bit-cell device dice 210 and 220 can be stacked vertically (e.g., in the y-direction) as shown in FIG. 1 or disposed in any other suitable arrangement. Notwithstanding the specific arrangement, embodiments of this design layout methodology form identical bit-cell device die structure. By providing identical die structure, the same layout design methodology of this embodiment permits a single or reduced set of masks to be utilized during fabrication. Furthermore, providing an IC design around a set of identical bit-cells simplifies the design or re-design, for example, when an ECO is required.

As further illustrated in FIG. 2, bit-cell device die 210 can be assigned an address of "00," in which case a multiplexer 211 of bit-cell device die 210 selects a connection path through TSV 215. In this case, multiplexer 211 can send a logic high value (e.g., "1") through a connection path of signal 215.8. Likewise, bit-cell device die 220 includes multiplexer 221, inverter 222, and TSVs 215. In this example, bit-cell device die 220 can be assigned an address of "01," enabling a logic high value through a connection path of signal 215.7. In this manner, each bit-cell device die can be independently addressed using common arrangement connection paths of TSVs 215.

Moreover, as shown in FIG. 3, address information of bit-cell device dice 310 and 320 can be assigned in memory using non-volatile storage structures 313 and 323, respectively. Bit-cell device dice 310 and 320 respectively include multiplexers 311 and 321, inverters 312 and 322, and control signals 315.1 to 315.8 transmitted through TSVs 315. Bit-cell device die 310 is assigned an address of "00," which is stored in non-volatile storage structure 313, and bit-cell device die 320 is assigned an address of "01" stored in non-volatile storage structure 323.

Embedding non-volatile address information in each individual device die (e.g., memory device die 310 and 320) permits address information for each bit cell to be protected. For example, address information can be maintained in an e-fuse or other non-volatile storage structure against faults due to electrical events, such as overcurrent, overvoltage, short circuits, and other electrical faults. In some embodiments, address information is maintained in device dice 310 and 320 by non-volatile storage structures 313 and 323. An embedded, non-volatile storage structure can be, but is not limited to an e-fuse, antifuse, floating gate, or other suitable storage structure. Bit-cell device dice 310 and 320 have identical structural arrangements, including TSVs and addressing elements. Thereby, the disclosed layout design methodology simplifies fabrication techniques and reduces mask requirements.

In some embodiments, each bit-cell device die 310 and 320 shares an identical structure and can be formed using a TSV architecture across multiple bit-cell device dice. Further, although shown in FIG. 3 as a vertically stacked arrangement, bit-cell device dice 310 and 320 can be stacked in any other suitable arrangement. Notwithstanding the specific arrangement, embodiments of this design layout methodology form identical bit-cell device die structure, thereby permitting simplified fabrication techniques and mask use.

FIG. 4 illustrates a memory structure 400, according to some embodiments. Memory structure 400 includes a first memory die 410, a second memory die 420, a third memory die 430, and a fourth memory die 440. Each of memory dice 410-440 respectively includes multiplexers 411-441 and inverters 412-442, which are configured to translate a memory address provided to each memory die.

In some embodiments, memory dice 410-440 can share an identical structure and be stacked vertically (e.g., in the y-direction). In other embodiments, memory dice 410-440 can be arranged in any suitable arrangement, such as a side-by-side arrangements, while retaining the benefit of a simplified formation processes and reduced mask requirement.

As shown in FIG. 4, stacking individual memory dice 410-440 permits the dice to be arranged where TSVs and connecting wires can coextend linearly (e.g., in the y-direction). By doing so, the dice can be connected to provide simplified addressing. Memory dice 410-440 can be connected to enable four identically structured dice to have different address information. Specifically, as shown in FIG. 4 and described in detail below, memory dice 410-440 can be variously connected to a processor die (not shown) by TSV such that each individual die retains unique address information.

For example, first memory die 410 can include TSVs 415 (e.g., a 3-bit TSV bus), connected by electrical connectors, a connection path 413, to another die, which can be control logic, such as an application processor (also referred to herein as a processor die, not shown). Connection path 413 traverses through each TSV to the processor die. Thereby, a logic high signal (e.g., "1") can be transmitted through each TSV 415 of first memory die 410 by the processor die. The resulting logic through the TSVs results in a binary signal "111" providing a unique address of "7" to the first memory die 410.

In some embodiments, each of first to fourth memory dice 410 to 440 is coupled to the adjacent die by a similar but varied connection path. Connection paths 413, 423, and 433 can include electrical connectors formed of any electrical conductor, such as one or more metals (e.g., copper, metal alloys, or any combination thereof). Connection paths 413, 423, and 433 can be formed by any connector formation process. In some embodiments, connection paths 413, 423, and 433 are formed by a hybrid bonding (HB) process.

Connection paths 413, 423, 433, and 443 are unique and include unique address identifiers. In each memory die 410-440, the connection paths for addressing are connected differently in the TSV stack. For example, the TSVs of each memory die can be internally pulled down, to be assigned a logic low value (e.g., "0"), whereas electrically connected TSVs are assigned a logic high value (e.g., "1") applied by the processor die. Thus, different address identifiers can be provided for each memory die.

Specifically, the TSV corresponding to the most significant hit (MSB) is internally pulled down (e.g., to ground or 0V), while the remaining TSVs are HB-connected (connected by the hybrid bonding process). Thus, the MSB is operably provided such that a logic low (e.g., "0") is maintained at the MSB of memory die 420. The resulting logic through the TSVs 415 results in a binary signal "011" providing a unique address of "3" to second memory die 420. Likewise, varying the connection paths 433 such that only the least significant bit (LSB) is electrically connected through TSV bus 415 generates a binary signal "001" providing a unique address of "1" to third memory die 430. Finally, the TSV bus of fourth memory die 440 (e.g., connection path 443) is not connected. Each respective hit of the corresponding TSVs are internally pulled down to, for example, ground or 0V. A unique address of "0" is thereby assigned.

Thus, two or more memory dice having formed by simplified mask requirements can be provided unique address information without requiring substantial structural differences. Varying connectivity of the three-wide TSV bus (TSVs 415) between the individual first to fourth memory dice 410, 420, 430, and 440 permits each to be uniquely addressed. Each memory die can then be addressed by the processor die for memory operations, e.g., through a chip-enable connection (not shown) to inverters 412, 422, 432, and 442 respectively.

Vertically stacking memory dice 410 to 440, as shown in FIG. 4, achieves other advantages and performance improvements in reducing a signal's critical connection path. That is, the vertical stack permits the shortest connection path by arranging TSVs in each respective memory die 410 to 440 overlap or coextend linearly. A 3DIC stacked in this manner and controlled through a reduced critical connection path achieves performance improvements with respect to higher bandwidth and power consumption. By providing a stacked structure, memory dice and connections can be arranged in three dimensions, achieving a greater diversity of (and shorter) connection paths, as well as scalability. Accordingly, greater memory density, faster access times, reduced power consumption, and faster data transfer can be achieved.

Figure 5:
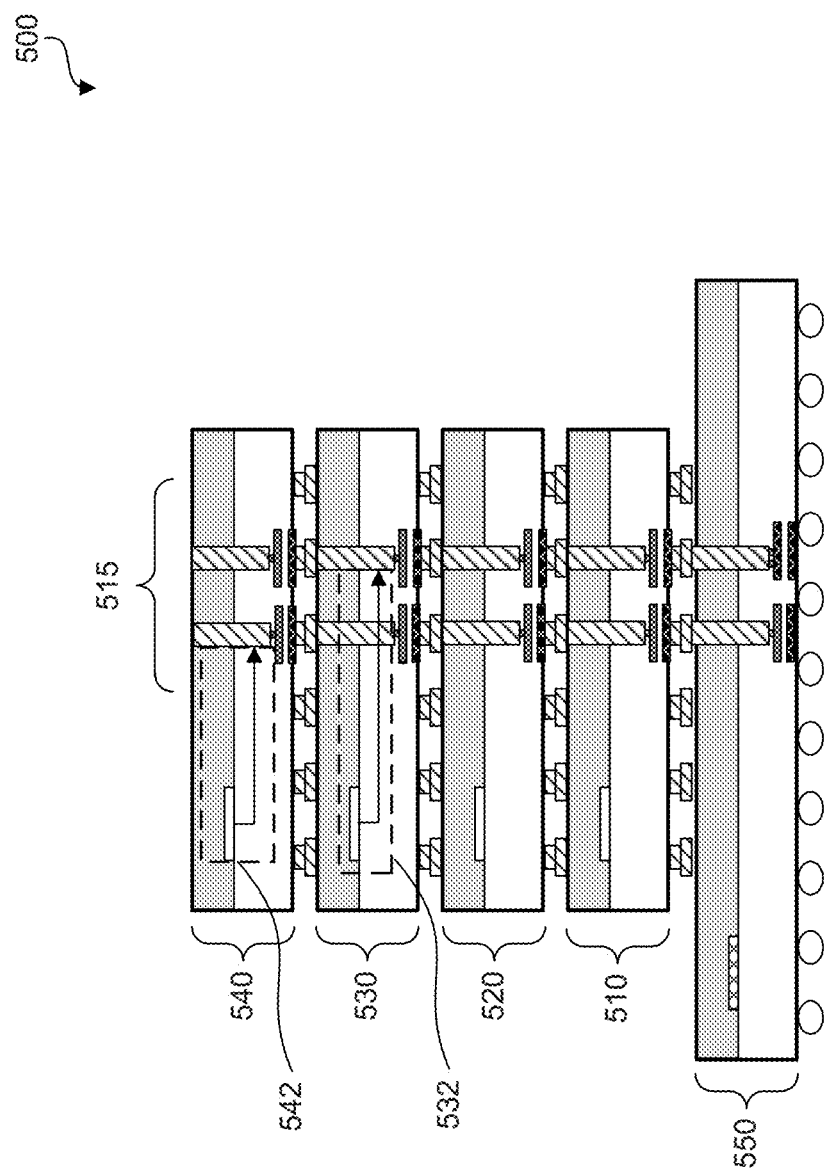
FIG. 5 is an illustration of a silicon on integrated chip structure with coextending through-silicon vias, according to some embodiments.

FIG. 5 illustrates an arrangement of an SOIC device unit 500 with coextending TSVs 515, according to some embodiments. SOW device unit 500 includes a processor die 550, shown as the bottom die in a stack. Processor die 550 includes a controller configured to provide processing and input/output functions. SoIC device unit 500 also includes a first device die 510, a second device die 520, a third device die 530, and a fourth device die 540. While TSVs 515 are arranged identically, other elements of the individual device dice can have distinct arrangements, in this example, CE signal circuitry 532 and 542 of the third device die 530 and fourth device die 540 can be distinct or have dissimilar structural arrangements, as described in greater detail below with respect to FIG. 6.

Figure 6:
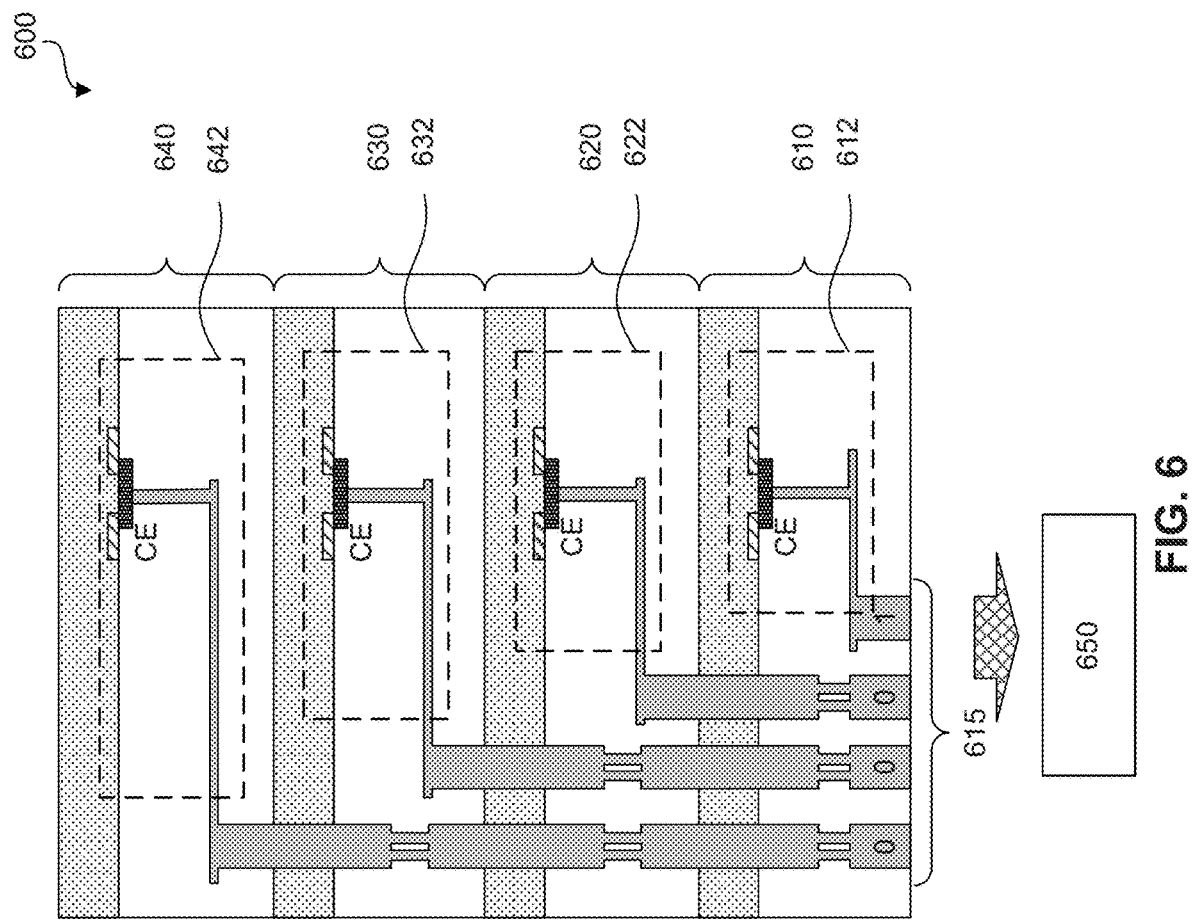
FIG. 6 is an illustration of a cross-section of a device having different through-silicon via (TSV) configurations, according to some embodiments.

FIG. 6 illustrates a memory device in which a stack of memory dice include dissimilar circuitry. In some embodiments, a memory device can be an SRAM, DRAM, MRAM, or other memory device. The memory device can include, for example, four memory dice stacked one over another, the stack arranged over a control logic, also referred to as an application processor (AP) or processor die. As shown in FIG. 6, a memory device can include a stack of memory cubes, specifically memory device dice 610, 620, 630, and 640, stacked vertically and connected to a processor die 650. The processor die 650 sends control, address, and data signals to each memory device die. The address and data can be shared with the four memory device die. However, some control signals are not shared. For example, the chip-enable signal (CE), which is provided to turn on each respective memory device die for memory operations, is not shared.

In order to activate each respective memory die for memory operations, the processor die 650 can provide a CE signal to one or more of memory dice 610 to 640. The CE signal can be provided through a connection path by a non-uniform TSV bus 615. The CE signal of each respective TSV of TSVs 615 is connected to a CE wiring 612, 622, 633, and 642, of each respective memory die 610, 620, 630, and 640. While other elements (not shown) of each memory die 610 to 640 can include common structure, the arrangement shown in FIG. 6 requires a dedicated and distinct TSV path for each CE signal. Thus, each memory die has a different configuration with respect to the TSV CE.

Figure 7:
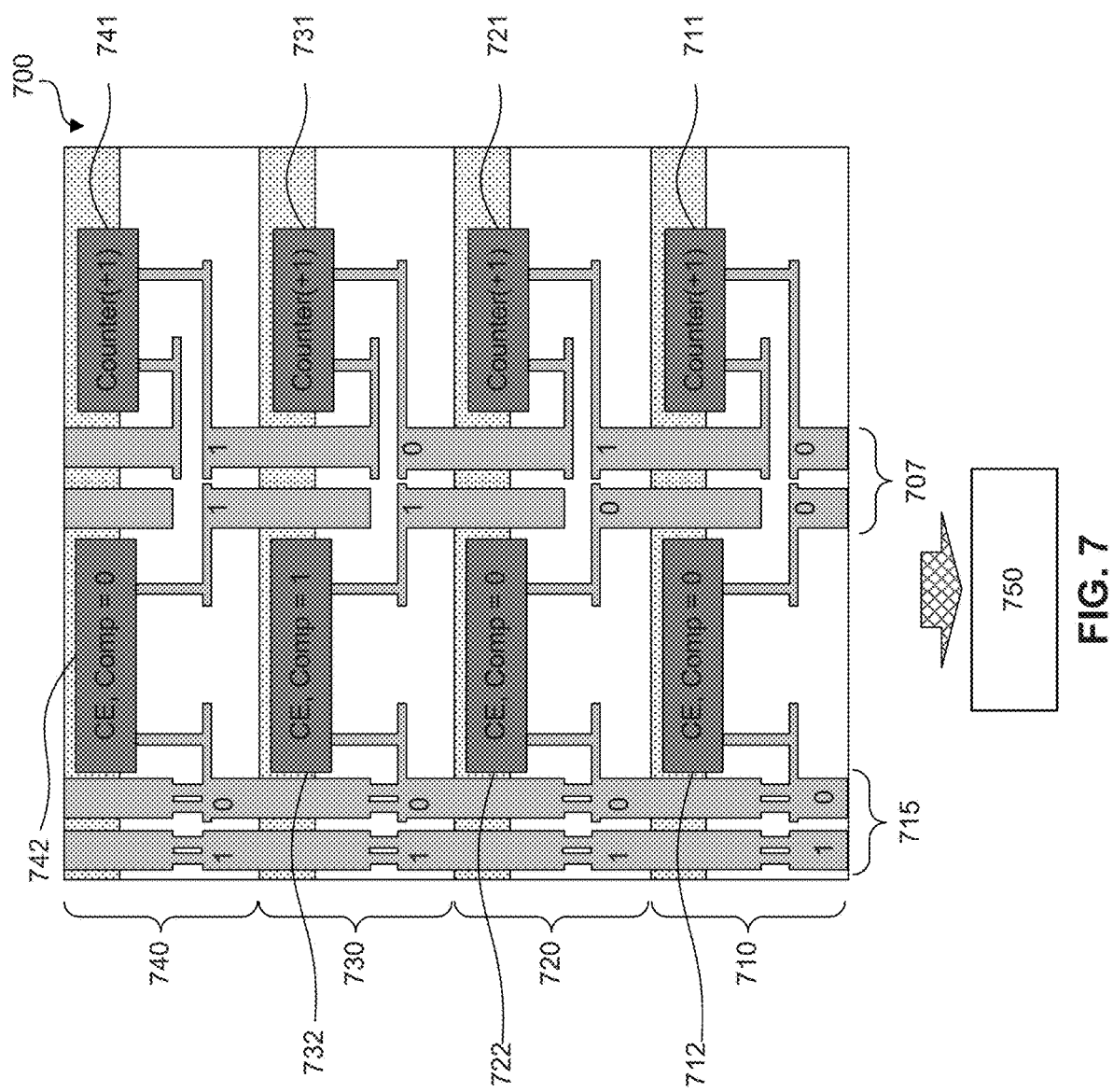
FIG. 7 is an illustration of a same design layout of device dice including logic circuitry, according to some embodiments.

In some embodiments, by adding a counter and comparator, it is possible to provide unique address identifiers to each memory cell without requiring excess or dummy TSVs. As shown in FIG. 7, an embodiment can include four memory dice 710, 720, 730, and 740 arranged in a vertical memory stack 700 and electrically connected to a processor die 750. Each memory die 710, 720, 730, and 740 includes counters 711, 721, 731, and 741, respectively. The counters can be electrically connected in series (e.g., by a daisy chain topology) as shown. Address information can be uniquely assigned to each respective memory die 710 to 740 by counters 711 to 741, respectively.

For example, a control logic signal 707 can be received by memory die 710 having two logic low bits (e.g., "00"). Memory die 710 is assigned the unique binary address "00." A counter 711 of memory die 710 increments the control logic signal by 1, outputting binary address "01" to adjacent memory die 720. Thus, memory die 720 is assigned the unique binary address "01" and includes counter 721 to continue the increment operation on the control logic signal. Memory dice 730 and 740 include counter structures and are assigned unique binary addresses (counters 731 and 741 and addresses "10" and "11," respectively).

Each memory die 710 to 740 also includes identical comparator and TSV structure. For example, memory dice 710, 720, 730, and 740 respectively include comparators 712, 722, 732, and 742. Each memory die also includes identically formed TSVs for carrying one or more CE signal lines 715. In some embodiments, CE signal line 715 includes two wires connected to each memory die. A signal can be transmitted through CE signal line 715 from processor die 750 to each memory die 710 to 740. Comparators 712 to 742 are electrically connected to the CE signal lines 715 and the unique memory address assigned by an adjacent die, as described above.

In this example, processor die 750 transmits a CE signal "10" to address the memory die having that unique address for memory operations. A comparator 712 of memory die 710 is connected to a CE signal ("10") and a control logic signal 707 that includes the assigned memory address ("00"; as described above). Comparator 712 can include, but is not limited to, a logic gate, such as an XNOR or other logic element. In this example, the compare operation determines that the signal and the unique address do not match, "CE, Comp=0." Thus, memory die 710 is not turned on for conducting a memory operation. The comparison is similarly performed by comparators 722, 732, and 742 of memory dice 720, 730, and 740, respectively. Comparator 732 of memory die 730 determines that its unique address ("10") corresponds to the CE signal, "CE, Comp=1." As a result, comparator 731 provides a logic high ("1") output, which is transmitted to a memory circuit (not shown). The logic high output enables or turns on memory die 730 for performance of one or more memory operations.

Thus, in some embodiments, an arrangement of counters can be electrically connected by a daisy chain topology such that unique identifiers are generated. A CE signal from a processor die is transmitted to turn on an individual memory die, whereby the CE signal is evaluated by a comparator with respect to each unique identifier. The memory dice are structurally identical and can include identical memory array circuitry (not shown). Accordingly, memory stack 700 can include memory dice having identical structure reducing fabrication requirements, including mask usage.

Figure 8:
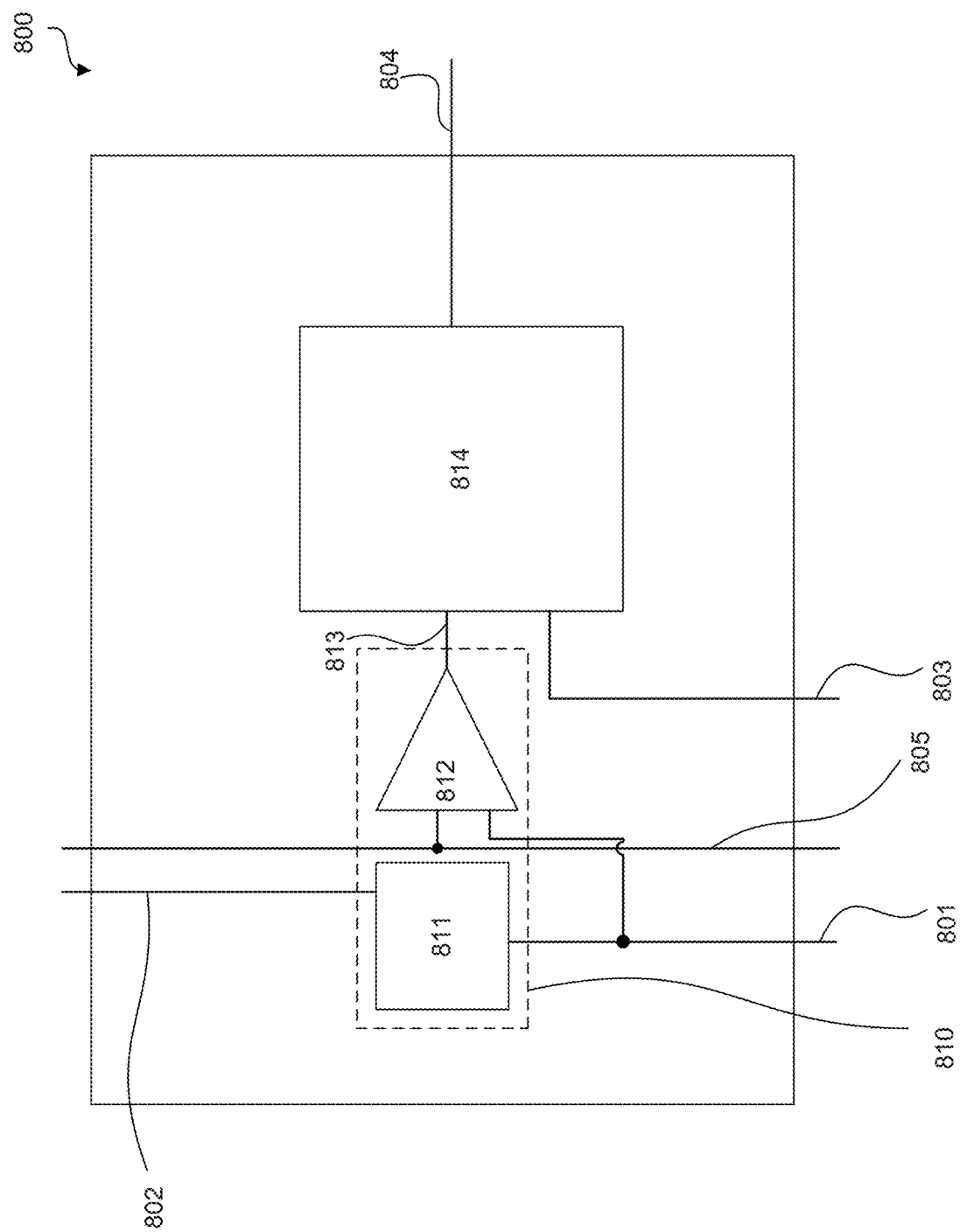
FIG. 8 is an illustration of a circuit arrangement of a system on integrated chip structure, according to some embodiments.

FIG. 8 is an illustration of an embodiment of a memory circuit 800, according to some embodiments. Memory circuit 800 includes a memory addressing circuit 810 and a memory array 814. Memory addressing circuit 810 is configured to receive a memory address signal 801 from an adjacent die and a CE signal 805 from a processor die (not shown), Additionally, memory circuit 800 is configured to receive memory operation instructions 803 from the processor die.

Memory addressing circuit 810 can include one or more logic circuits. For example, memory addressing circuit 810 includes a counter 811 and a comparator 812. Counter 811 performs an operation to increment memory address signal 801 as incremented memory address signal 802. Incremented memory address signal 802 is output by counter 811, which can be provided to an adjacent memory die (not shown), as a memory address signal.

Comparator 812 compares a CE signal 805 to memory address signal 801 and generates a comparator output 813 based on a determination whether CE signal 805 and memory address signal 801 match. For example, if the comparison operation determines that the signals do not match, then the comparator can be configured to output a logic low value (e.g., "0") as comparator output 813. If the comparison operation determines that the signals match then the comparator can output a logic high value (e.g., "1") as comparator output 813.

Memory array 814 can be configured to receive comparator output 813 to determine whether to enable a memory operation, such as a memory read or write operation based on memory operation instructions 803. A memory output 804 of memory array 814 can be transmitted based on the memory operation, for example, to the control logic. For example, if CE signal 805 matches memory address signal 801, and if memory operation instructions 803 include a memory read command, then a memory value stored in memory array 814 is output as memory output 804.

Figure 9:
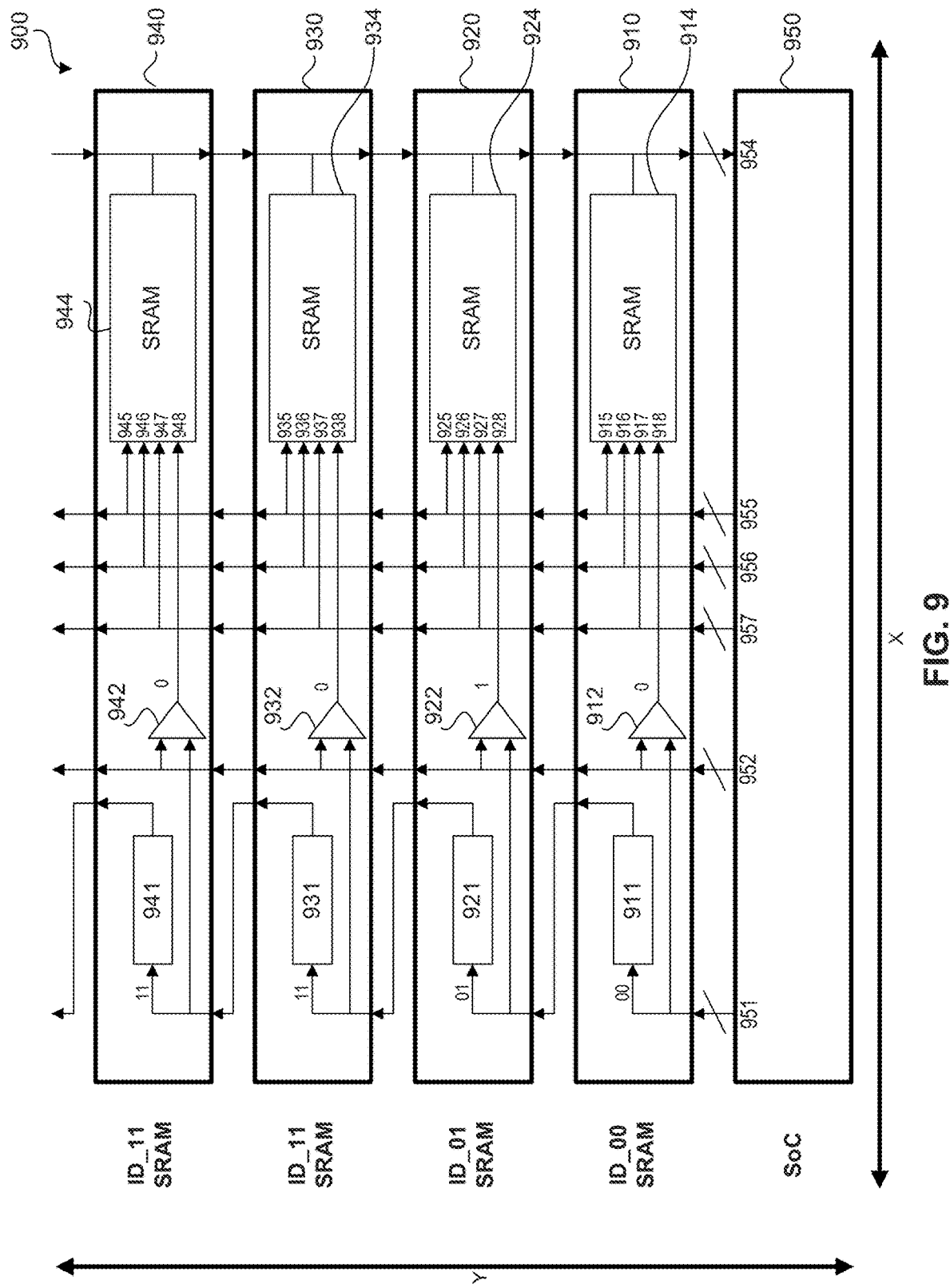
FIG. 9 is an illustration of a an arrangement of system on integrated chip structures including device dice each with logic circuitry and memory arrays, according to some embodiments.

FIG. 9 illustrates a cross section of a memory, device 900, according to some embodiments. Memory device 900 includes a processor die 950, a first memory die 910, a second memory die 920, a third memory die 930, and a fourth memory die 940. In some embodiments, first to fourth memory dice 910 to 940 are stacked vertically. However, the dice can alternatively be arranged in any suitable manner, e.g., side-by-side.

Processor die 950 is configured to output a memory address initialization signal 951, a CE signal 952, a memory operation address signal 957, a memory operation instruction signal 956, and a data_in signal 955. Processor die 950 is further configured to receive a signal from data_out signal line 954 from the stack of first to fourth memory dice 910 to 940. Each of the foregoing signals 951, 952, and 954 to 957 can include one or more signal wires. Furthermore, each of signals 951, 952, and 954 to 957 can include one or more signal wires can be provided to the first to fourth memory device die 910 to 940 by one or more TSVs. For example, data_in signal 955 can be provided in a TSV (not shown) each of first to fourth memory die 910 to 940. As described throughout this disclosure, one advantage is that each of first to fourth memory die 910 to 940 can have an identical structural arrangement, such that TSVs can co-extend linearly (e.g., in the y-direction).

First memory die 910 includes a counter 911, a comparator 912, and a memory array 914, In this example, first memory die 940 receives memory address initialization signal 951 from processor die 950. The memory address initialization signal 951 is initialized by processor die 950 as a logic low value (e.g., "00"), Accordingly, first memory die 940 is assigned a first memory die address "00." Counter 911 increments this memory address initialization signal and outputs the incremented result (e.g., "01") to second memory die 920.

Comparator 912 compares memory address initialization signal 951 to CE signal 952 received from processor die 950. In this example, CE signal 952 is set to a binary value of "01." Comparator 912 determines that the value of CE signal 952 (e.g., "01") does not match the memory address of first memory die 910 and outputs "0" as the comparator result.

Memory array 914 is configured to receive a data_in signal 915, a memory operation signal 916, a memory operation address signal 917, and a memory operation enable signal 918. An output signal line of memory array 914 is also connected to an data_out signal line 954. In this example, an output from comparator 912 is provided to memory array 914 as memory operation enable signal 918, providing an enable instruction "0" corresponding to an instruction for the memory array not perform a memory operation.

In some embodiments, second memory die 920, third memory die 930, and fourth memory die 940 include an identical structure to first memory die 910. That is, memory dice 910 to 940 respectively include counters 911 to 941 and comparators 912 to 942, which can collectively correspond to a logic circuit (e.g., memory addressing circuit 810) as shown in FIG. 8. Likewise, memory dice 910 to 940 respectively include memory arrays 914 to 944. As in the embodiment of FIG. 8, counters 911 to 941 are configured to sequentially increment a value of a memory address initiated by processor die 950 as memory address initialization signal 951 and to output the incremented value to the next adjacent memory die.

Comparators 912 and 942 each compare the CE signal from processor die 950 to a corresponding memory die address assigned to the respective memory dice 910 to 940. In this example, comparator 922 of the second memory die 920 determines that the value of CE signal 952 (e.g., "01") matches the memory address (e.g., "01") provided to the second memory die 920. Thus, comparator 922 outputs "1" as the comparator result. The comparator 922 result of "1" thereby enables memory array 924 to perform an operation based on memory operation signals received from processor die 950.

As shown in FIG. 9, input ports and output ports of memory dice 910 to 940 corresponding to CE signal 952 of processor die 950 can be arranged to overlap (e.g., coextend linearly in the stack such as in the y-direction shown in FIG. 9).

As noted above, processor die 950 provides instruction signals (data_in signal 955, memory operation signal 956 and memory operation address signal 957) to each memory die. Memory array 924 is enabled by comparator 922 in this example. Specifically, memory array 924 receives an instruction from the comparator output ("1") as a memory operation enable signal 928, enabling the memory array 924 to perform a memory operation. The memory operation is performed based on memory operation address signal 957, memory operation instruction signal 956, and data_in signal 955, which are received from processor die 950. Memory operation Address signal 957, memory operation instruction signal 956, and data_in signal 955 are received in memory array 924 as memory operation address signal 927, a memory operation signal 926, and data_in signal 925, respectively. If the memory operation, such as a read operation, generates data to be output, memory array 924 transmits the output to data_out signal line 954, to be received by processor die 950.

Figure 10:
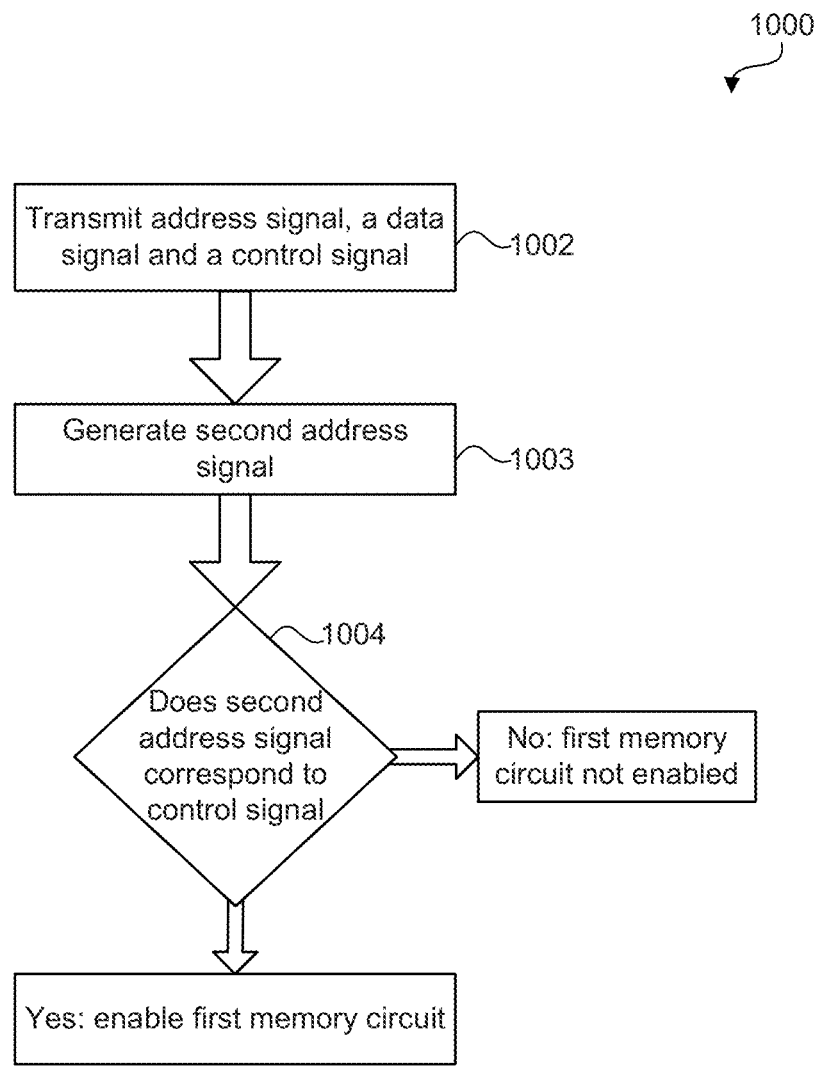
FIG. 10 is a flow diagram of a method for addressing on integrated chip structures having identical design layouts, according to some embodiments.

FIG. 10 is a flow diagram of a method 1000 for addressing device structures, according to some embodiments of the present disclosure. In some embodiments, the device structures can be SOIC structures, such the structures described above with respect to FIGS. 1-9. Based on the disclosure herein, operations in method 1000 can be performed in a different order and/or vary.

Referring to FIG. 10, at operation 1002, a processor die transmits an address signal, a data signal, and a control signal to a first device die, which can be a first memory die such as first memory die 910 shown in FIG. 9. The first device die receives the address signal in a first TSV and the control signal by a second TSV. The first and second TSV can be disposed in the first memory device.

At operation 1003, the first device die generates a second address signal based on a first address signal. In some embodiments, the second address signal can be generated using a counter device, such as using a counter 911 in FIG. 9, or otherwise by using an arithmetic processor, or other incrementing operation. The first device die outputs the second address signal to a second device die. In some embodiments, the second device die can be memory device die, such as second memory die 920 in FIG. 9. In some embodiments, the control signal is output, or permitted to pass through, to the second device die by a second TSV of first memory die 910. The second address signal and the control signal can be received by the second device die through a third TSV and a fourth TSV, which can be disposed in the second device die.

At operation 1004, the first device die determines, based on the control signal, whether to enable a circuit for performing circuit-specific operations (e.g., enable a memory circuit to perform memory read or memory write operations). In some embodiments, the first device die determines to enable the circuit based on comparing the control signal to the first address signal. For example, the circuit can be enabled if the control signal corresponds to the first address signal, and the circuit can be disabled or not enabled if the control signal does not correspond to the first address signal. Operations 1003 and 1004 can be repeated with respect to the second device die (and subsequent device dies).

Embodiments of the present disclosure are directed to a layout design methodology to enable a same mask set or reduced mask set to be used in the fabrication processes of device die (e.g., multiple memory device die stacked on top of one another). The methodology reduces the need to consider mask alterations in fabrication processes, even for different designs. Moreover, using the same mask set or reduced mask set can reduce the risk of using an incorrect mask in fabrication processes. Still further, because the same I/O routing can be used in each memory die, the design and simulation of such circuitry can be made redundant and efficient. Embodiments of the present disclosure are described but not limited to SOW structures, 3DIC memory stacks or memory circuits. In other embodiments, one or more memory dice may be substituted by one or more other chip packages, such as one or more processors or other suitable package. Further, while the above arrangements are described with respect to a vertical stack of two to four memory dice, other arrangements are possible. For example, other embodiments may include a stack having any number of vertically arranged device dice, a side-by-side arrangement of individual bit cells or device dice, or any other suitable arrangement, while retaining the benefits described herein.

Embodiments of the present disclosure include a device, including a processor die, a first memory die stacked over the processor die, and a second memory die stacked over the first memory die. The first memory die includes a first TSV and a first memory circuit. The second memory die includes a second TSV and a second memory circuit. The first TSV and the second TSV coextend linearly. In some embodiments, the first memory die and the second memory die are three dimensional integrated circuit (3DIC) memory cells. The first memory die and the second memory die may be 3DIC memory dice that are stacked face to back (F2B) over the processor die. In some embodiments, the first memory die includes a first logic circuit and the second memory die includes a second logic circuit electrically connected to the first logic circuit. The first logic circuit is configured to generate a first memory die address, and the second logic circuit is configured to generate a second memory die address different from the first memory die address. The first logic circuit includes a first comparator, and the second logic circuit includes a second comparator. In some embodiments, the first logic circuit includes a first counter, and the second logic circuit includes a second counter. The second logic circuit is electrically connected to the first logic circuit by the first TSV and the second TSV. In some embodiments, the device further includes a third memory die stacked over the second memory die and a fourth memory die stacked over the third memory die. The third memory die includes a third TSV, a third logic circuit and a third memory circuit. The fourth memory die includes a fourth TSV, a fourth logic circuit, and a fourth memory circuit. In some embodiments, the first TSV, second TSV, third TSV and fourth TSV are linearly coextensive. The third logic circuit includes a third comparator and a third counter. The fourth logic circuit includes a fourth comparator and a fourth counter. In some embodiments, the first counter, second counter, third counter, and fourth counter are electrically connected in series in the first TSV, second TSV, third TSV and fourth TSV.

According to some embodiments, a memory die includes a first through-silicon via (TSV) having a first input port. The memory die further includes a first output port and a second output port, wherein the second TSV includes a second TSV including a second input port, and a second output port. The memory device also includes a memory circuit and a logic circuit. The first input port is configured to receive a first input value, and the second input port is configured to receive a second input value. The logic circuit is configured to generate a memory die address based on the first input value and compare the address to the second input value. In some embodiments, the logic circuit of the memory die includes a comparator and a counter. In some embodiments, the logic circuit of the memory die is configured to output the memory die address to the first output port. In some embodiments, the memory die receives the first input value and the second input value from a second memory die that is structurally identical to the memory die. In some embodiments, second input port and the second output port coextend linearly.

According to some embodiments, a processor or logic die provides includes a processor that stores one or more instructions. The control device die can execute the one or more instructions, the one or more instructions, when executed by the processor, configuring the processor to provide a memory address initialization signal to connected device die. Such device dice can be connected in series to the memory address initialization signal, each device incrementing said signal. According to some embodiments, the control device die, an address signal, a data signal and a control signal to a first memory die. A first memory die can receive the address signal in a first through-silicon via (TSV), a control signal by a second TSV. The first memory die can generate a second address signal based on the first address signal and determine to enable a memory circuit based on the control signal, The first memory die can output the second address signal to a second memory die.

The first memory die can determine to enable the memory circuit based on comparing the control signal to the second address signal. According to some embodiments, a memory circuit is enabled if the control signal corresponds to the second address signal, and memory circuit is not enabled if the control signal does not correspond to the second address signal. A second memory die can receive the second address signal in a third TSV, the control signal by a fourth TSV. The second memory die can generate a third address signal based on the second address signal. The second memory die can enable a second memory circuit based on the control signal and output the third address signal and the control signal.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first die;
   a second die stacked over the first die, wherein the second die comprises:
      a first through-silicon via (TSV); and
      a first circuit including a first memory and a first counter configured to assign a first binary address to the first memory; and
   a third die stacked over the second die, wherein the third die comprises:
      a second TSV; and
      a second circuit including a second memory and a second counter configured to assign a second binary address to the second memory,
   wherein the first TSV and the second TSV are linearly coextensive.

2. The device of claim 1, wherein the second die and the third die form a three dimensional integrated circuit (3DIC) memory stack.

3. The device of claim 1, wherein the second die and the third die are stacked face to back (F2B) over the first die.

4. The device of claim 1, wherein the second die comprises a first logic circuit and the third die comprises a second logic circuit electrically connected to the first logic circuit;
   wherein the first die is configured to generate a first memory die address corresponding to the second die,
   wherein the first logic circuit is configured to generate a second memory die address corresponding to the third die, and
   wherein the second logic circuit is configured to generate a third memory die address different from the first memory die address and the second memory die address.

5. The device of claim 4, wherein the first logic circuit comprises a first comparator, and the second logic circuit comprises a second comparator.

6. The device of claim 4, wherein the first counter and the second counter are electrically connected in series.

7. The device of claim 4, wherein the second logic circuit is electrically connected to the first logic circuit by the first TSV and the second TSV.

8. The device of claim 7, further comprising:
   a fourth die stacked over the third die, wherein the fourth die comprises a third TSV, a third logic circuit, and a third memory circuit; and
   a fifth die stacked over the fourth die, wherein the fifth die comprises a fourth TSV, a fourth logic circuit, and a fourth memory circuit,
   wherein the first TSV, the second TSV, the third TSV, and the fourth TSV are linearly coextensive.

9. The device of claim 8, wherein:
   the first logic circuit comprises a first comparator and a first counter;
   the second logic circuit comprises a second comparator and a second counter;
   the third logic circuit comprises a third comparator and a third counter; and
   the fourth logic circuit comprises a fourth comparator and a fourth counter.

10. The device of claim 9, wherein the first counter, the second counter, the third counter, and the fourth counter are electrically connected in series by the first TSV, the second TSV, and the third TSV.

11. A device, comprising:
    a processor die, comprising:
       a microprocessor circuit formed on a front surface of the processor die; and
       electrical connectors formed on a back surface of the processor die; and
    a memory stack disposed over the processor die, the memory stack comprising a plurality of memory dies, each memory die comprising:
       a memory circuit formed on a front surface of the memory die;
       an interconnect structure formed on a back surface of the memory die;
       a through-silicon via (TSV) coupling the memory circuit to the interconnect structure; and
       a counter configured to assign a binary address to the memory die.

12. The device of claim 11, wherein each memory die further comprises address information embedded in a non-volatile storage structure.

13. The device of claim 11, wherein two or more of the TSVs of respective memory dies in the memory stack are aligned vertically with one another.

14. The device of claim 11, wherein the plurality of memory dies are configured to receive individual addressing signals and a common control signal.

15. The device of claim 11, wherein the plurality of memory dies are stacked face-to-face so that respective memory circuits face one another.

16. The device of claim 11, wherein the plurality of memory dies are stacked face-to-back so that a memory circuit of one memory die faces the interconnect structure of an adjacent memory die.

17. A memory device, comprising:
    a first memory die, comprising:
       a first memory circuit formed on a front surface of the first memory die,
       a first interconnect structure formed on a back surface of the first memory die, and
       a first through-silicon via (TSV) coupling the first memory circuit to the first interconnect structure; and
       a first counter formed on a front surface of the first memory die; and
    a second memory die on the first memory die, the second memory die comprising:
       a second memory circuit formed on a front surface of the second memory die,
       a second interconnect structure formed on a back surface of the second memory die,
       a second TSV coupling the second memory circuit to the second interconnect structure; and
       a second counter formed on a front surface of the second memory die, the second counter electrically connected in series with the first counter;

wherein the first and second memory circuits are different from one another.

18. The memory device of claim 17, wherein the first and second memory dies comprise one or more of a static random-access memory (SRAM), a dynamic random-access memory (DRAM), a magneto-resistive random-access memory (MRAM), and combinations thereof.

19. The memory device of claim 17, wherein the first and second memory circuits are configured to receive respective addressing signals.

20. The memory device of claim 17, wherein the first and second memory circuits are configured to receive a common control signal via the first and second TSVs.

* * * * *